United States Patent [19]

Held

[11] Patent Number: 4,565,770
[45] Date of Patent: Jan. 21, 1986

[54] PROCESS FOR DOT ETCHING ACID SOLUBLE PHOTOPOLYMERIZABLE ELEMENTS UTILIZING CHEMICALLY SOLUBLE PIGMENTS

[75] Inventor: Robert P. Held, Englishtown, N.J.

[73] Assignee: E. I. Du Pont de Nemours and Company, Wilmington, Del.

[21] Appl. No.: 670,949

[22] Filed: Nov. 13, 1984

[51] Int. Cl.$^4$ .......................... G03C 5/16; G03C 5/24; G03C 5/38; G03C 1/68

[52] U.S. Cl. ........................................ 430/294; 430/6; 430/273; 430/323; 430/325; 430/331; 430/270; 430/278; 430/277; 430/275; 430/910; 156/659.1; 156/661.1

[58] Field of Search .................... 430/6, 294, 273, 323, 430/325, 331, 270, 278, 277, 275, 910; 156/659.1, 661.1

[56] References Cited

U.S. PATENT DOCUMENTS

| | | | |
|---|---|---|---|
| 3,415,698 | 12/1968 | Hellmig et al. | 430/6 X |
| 3,961,961 | 6/1976 | Rich | 430/281 X |
| 4,173,673 | 11/1979 | Bratt et al. | 428/217 |
| 4,357,416 | 11/1982 | Fan | 430/273 X |
| 4,409,115 | 10/1983 | Sondergeld | 430/331 X |

FOREIGN PATENT DOCUMENTS 57-111532 7/1982 Japan.

Primary Examiner—John E. Kittle
Assistant Examiner—Cynthia Hamilton

[57] ABSTRACT

Process for preparation of dot-etched photopolymerizable lithographic film which comprises (a) exposing imagewise a photopolymerizable element consisting essentially of a support bearing (i) layer of acid soluble photopolymerizable composition having dispersed therein a chemically soluble pigment; or (ii), in order, (a) layer of acid soluble photopolymer having dispersed therein chemically soluble pigment, (b) layer of clear, unpigmented acid soluble photopolymer composition; or (iii), in order, (a) nonphotosensitive layer of an aqueous soluble polymeric binder having dispersed therein chemically soluble pigment, (b) layer of clear unpigmented acid soluble photopolymer composition, and optionally on each of said elements an overcoat layer; (b) developing the exposed element with acid solution; and (c) treating the developed element with a chemical solubilizing agent for the pigment. Lithographic films are prepared.

22 Claims, 13 Drawing Figures

PROCESS FOR DOT ETCHING ACID SOLUBLE PHOTOPOLYMERIZABLE ELEMENTS UTILIZING CHEMICALLY SOLUBLE PIGMENTS

DESCRIPTION

1. Technical Field

This invention relates to a process for the preparation of a dot-etched lithographic film. More particularly this invention relates to a process for the preparation of a dot-etched lithographic film having an acid soluble photopolymerizable layer.

2. Background Art

In the photomechanical trades, a mask containing an image that is opaque to actinic radiation is used in preparing a printing plate of some kind, e.g., letterpress, lithographic, etc. The mask is used as a phototool in exposing a layer of photosensitive resist-forming material present on a metal or plastic plate or a photopolymer printing plate matrix. After the exposure the printing plate is formed by etching or liquid development depending on the system present. The image in the mask must be of the highest possible contrast, e.g., completely opaque black in the image areas, and completely transparent (free from fog) in the unexposed areas. Silver halide film known as "litho" film is used to prepare the mask. When a litho film is exposed through a halftone screen and developed, it contains an image comprised of dots. The dots correspond to the areas of the film under the transparent areas of the halftone screen and are comprised of exposed and developed material. In silver halide litho film, these dots may be reduced in size by a process referred to as "dot-etching", i.e., reducing the size of, or "etching" the halftone dots, thereby changing the tone values of the image. In silver halide films dot-etching is accomplished chemically by treating the films with a silver "solvent". Silver halide films are expensive and require special red light handling.

Bratt and Cohen in U.S. Pat. No. 4,173,673 claim a dot-etchable mask prepared by imagewise exposure of a photopolymerizable element which comprises a support bearing a photopolymerizable layer having an optical density in the actinic region of at least 3.0 and having a thickness no greater than 0.015 mm. A removable cover sheet or a soluble overcoat layer can be present on the photopolymerizable layer. After the exposure through a halftone screen, the polymerized dots have a hardened upper skin which rests on softer undervolume having a lesser degree of polymerization or hardening. The dots are reducible in size by undercutting the polymeric dots with a solvent for the softer undervolume and removing hardened polymer from the edges of the hardened upper skins by mechanical action on the image bearing surface of the mask. The dot-etching of photopolymerizable element as described above requires the proper balance of the imagewise exposure and the undercutting of the polymeric dots with a solvent and mechanical action on the image bearing surface of the mask.

Assignee's pending application U.S. Ser. Nos. 635,346, 635,347 and 635,348 filed July 27, 1984 describe dot etching processes for caustic soluble photopolymerizable films in which pigments are selectively dot etched with a chemical solubilizing agent for the pigment. These processes do not require solvent undercutting of the polymerized image or dots or use of mechanical action on the image or dots.

It is therefore desirable to provide a process whereby a dot-etched photopolymerizable lithographic film is prepared from a photopolymerizable element containing one or more acid soluble photopolymer layers which does not require solvent undercutting of the polymerized image or dots as well as the use of mechanical action on the image or dots.

BRIEF DESCRIPTION OF DRAWING

In the accompanying drawing forming a material part of this disclosure.

DISCLOSURE OF THE INVENTION

Figure 1A:
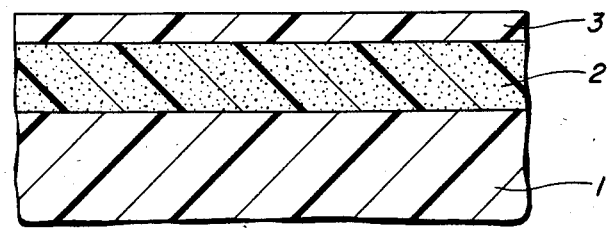
FIGS. 1A, 2A and 4A are cross-sections of photopolymerizable elements useful in the process of this invention.

In accordance with this invention, there is provided a process for the preparation of a dot-etched photopolymerizable lithographic film which comprises (A) exposing imagewise to actinic radiation a photopolymerizable element taken from the group consisting of
  (i) a support bearing, in order, a layer of an acid soluble photopolymerizable composition, and, optionally, an aqueous soluble overcoat layer, the photopolymerizable layer having dispersed therein a chemically soluble pigment;
  (ii) a support bearing, in order
    (a) a layer of acid soluble photopolymerizable composition having dispersed therein a chemically soluble pigment,
    (b) a layer of clear, unpigmented aqueous soluble photopolymerizable composition which is the same or different from the composition of layer (a), and, optionally,
    (c) a clear aqueous soluble overcoat layer; and
  (iii) a support bearing, in order
    (a) a nonphotosensitive layer of an aqueous soluble polymeric binder having dispersed therein a chemically soluble pigment,
    (b) a layer of a clear, unpigmented acid soluble photopolymerizable composition comprising an acid soluble binder, and, optionally,
    (c) a clear aqueous soluble overcoat layer;
(B) developing the exposed element with an acid solution with the proviso that when the photopolymerizable element is type (iii) the acid development solution is followed by treatment with water; and
(C) treating the developed element with a chemical solubilizing agent for the pigment whereby there occurs diffusion etching of the image.

The invention is based on the discovery of the process of reducing exposed and developed areas (especially halftone dots) of a photopolymerizable element and that photopolymerizable elements usable in this process can be obtained using chemically soluble pigment dispersed in either (i) a single acid soluble photopolymerizable layer, (ii) an acid soluble photopolymer layer beneath a clear photopolymer layer, or (iii) a nonphotosensitive layer beneath a clear photopolymer layer. The photopolymerizable layers and nonphotosensitive layer used in the elements are thin, ranging in dry thickness from 0.0001 to 0.001 inch (0.0025 to 0.025 mm) which give good image quality and tonal range. Imagewise exposure to actinic radiation, e.g., in the region 320 to 450 nm, produces hardened areas or dots in the photopolymerizable layer corresponding to the transparent areas of the stencil, mask or process transparency through which the element is exposed. Development of the elements after exposure is by washout of unexposed areas down to the base with an acidic solution for the unexposed areas. The developed element containing polymerized hardened areas or dots is treated with a solubilizing agent for the pigment dispersed therein described more fully below. By means of diffusion etching of the polymerized image, the size of the pigmented image is reduced without substantially removing the polymerized hardened area or dot, i.e., without substantially affecting the thickness of the photopolymer layer. In the single layer embodiment (i) the density of the pigmented image is also reduced. In embodiment (ii) the density of the pigmented image can also be reduced, if desired. This is accomplished by extended etching whereby the etchant reaches the top surface of a pigmented image by diffusion through the clear photopolymer layer.

While compositions prepared according to the present invention can be processed by hand by washing and rinsing with water and acid solutions, a preferred method is to pass them through an automatic processing machine where the temperature and spray pattern of the processing solutions can be regulated. Also within a machine the speed of advance can be regulated so that a thicker film can be passed through at a slower rate in order to allow a larger amount of polymer to be adequately removed. A first section of such a machine can spray a film to wash off a water soluble protective overcoat that may be present. A second section can spray a film with a mild acid solution to solubilize polymer in the unexposed areas of the film. A third section can spray the film to remove the solubilized polymer and produce an image using either hot or cold water.

The photopolymerizable elements useful in the inventive process are element (i) a dry single caustic soluble photopolymerizable layer on a support, the photopolymerizable layer having dispersed therein a chemically soluble pigment to provide an optical density in the actinic region of at least 2.5; element (ii) two dry acid soluble photopolymerizable layers on a support, the upper layer being clear and the lower layer having dispersed therein chemically soluble pigment in sufficient amount to provide an optical density in the actinic region of at least 2.5; and element (iii) two dry soluble layers on a support, the upper layer which is photopolymerizable and acid soluble being clear (unpigmented) and the lower layer being nonphotosensitive and aqueous soluble having dispersed therein a chemically soluble pigment in sufficient amount to provide an optical density in the actinic region of at least 2.5. Optionally, but preferably, a thin layer of an aqueous soluble overcoat layer is present as an outer protective layer. The overcoat layer is generally 0.00003 to 0.0003 inch (0.0008 to 0.008 mm) in thickness.

The acid soluble photopolymerizable composition used to form a dry photopolymerizable layer is prepared from (a) 3 to 97 parts by weight of at least one ethylenically unsaturated compound having at least one terminal ethylenic group, preferably at least two such terminal ethylenic groups;

(b) 97 to 3 parts by weight of a polymeric binder soluble in acidic solution; and (c) 0.1 to 10 parts by weight of a free radical generating addition polymerization photoinitiator or initiator system wherein two or more compounds make up the initiator system.

Other components can be present in the photopolymerization composition as is known to those skilled in the art, e.g., polymerization inhibitor, plasticizer, antihalation compounds, optical brightening agents, etc.

Suitable monomers useful in the photopolymerizable compositions include those described in U.S. Pat. Nos. 2,760,863; 2,791,504; 2,927,022; 3,261,686 and 3,380,831, the disclosures of which are incorporated herein by reference. Monomers which can be used as the sole monomer or in combination with others include: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylol propane triacrylate, pentaerythritol triacrylate, polyoxyethylated trimethylol propane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylae, trimethylol propane ethoxylate triacrylate, pentaerythritol trimethacrylate, 1-phenyl ethylene-1,2-dimethacrylae, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

Polymeric organic acid soluble binders useful in the photopolymerizable compositions are polymers which contain one or more groups which can accept a proton to produce a water soluble species. Amine containing polymers are particularly useful as binders in which the protonated amine serves to solubilize the binder when treated with acid. Examples of acid soluble binders include: 2-dimethylamino ethyl methacrylate/methylmethacrylate copolymer, polyvinylpyridine, dimethylaminoethylmethacrylate polymer, formaldehyde-amine condensation polymers, dimethylaminoethylmethacrylate/hydroxyethyl methacrylate/methylmethacrylate polymer and laurylmethacrylate/methylmethacrylate/dimethylaminoethylmethacrylate/hydroxyethyl methacrylate polymer, etc.

Suitable photoinitiators or initiator systems include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers: alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Also useful with photoinitiators and photoinhibitors are sensitizers disclosed in Dueber U.S. Pat. No. 4,162,162. The disclosures of the patents listed above are incorporated herein by reference.

Thermal polymerization inhibitors that can be used in photopolymerizable compositions are: p-methoxyphenyl, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in Pazos U.S. Pat. No. 4,168,982.

In addition to the binder, monomer and initiator, the photopolymer composition may contain other additives such as known plasticizers, dyes, pigments, optical brightening agents, adhesive aids, fillers, antihalation compounds, etc.

The aqueous soluble nonphotosensitive composition used to form the lower dry layer of element (iii) comprises at least one polymeric binder, e.g., gelatin, gum arabic, polyvinyl alcohol, polyvinyl pyrrolidone, or similar synthetic polymer. Other components which can be present in the nonphotosensitive layer are surfactants, dispersants, etc.

Dispersed in a photopolymerizable layer of elements (i) and (ii) (bottom photopolymerizable layer of element (ii)) or nonphotosensitive layer of element (iii) during the preparation of the photopolymerizable compositions, e.g., as shown in the examples below or as known to those skilled in the art, are chemically soluble pigments to provide an optical density in the actinic region of at least 2.5. Suitable chemically soluble pigments include: zinc oxide, copper, cupric oxide, aluminum, nickel, brass, bronze, silver, e.g., colloidal silver, etc. The average particle size ranges from 0.01 to 10 $\mu$m. Based on the weight of the dry photopolymerizable layer, the pigment can be present in a range of 25 to 75% by weight, preferably 35 to 55% by weight.

Supports on which the layer(s) of the invention is (are) present or adhered include films composed of high polymers which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088 and Alles, U.S. Pat. No. 2,779,684, with or without the surface coating described in the former patent, the disclosures of which are incorporated herein by reference. The support may have a resin "sub" or other layer thereon which may or may not be soluble and which for purposes of this invention is considered part of the support. However, the total thickness of the photopolymerizable layer and any soluble sub or underlayer should not exceed 0.003 inch (0.075 mm). By "soluble" is meant solubility in a solvent in which the photopolymerizable layer is developable. Preferred soluble sub layers have a thickness not exceeding about 0.0002 inch (0.005 mm). Where the particular application does not require that the base support be transparent, the photopolymerizable composition may usefully be coated on an opaque support, such as paper, especially water-proof photographic paper; thin metal sheets, especially aluminum and copper sheets, cardboard, etc.

The optional, but preferred, overcoat layer present on the side of the photopolymerizable layer opposite the support is an aqueous soluble layer. The overcoat layer can be soluble in water alone. Suitable overcoat layers are described in Alles U.S. Pat. No. 3,458,311, the disclosure of which is incorporated herein by reference, e.g., polyvinyl alcohol and its partial esters, ethers and acetals that contain a substantial amount of unsubstituted vinyl alcohol units so that they have the requisite solubility in water. Suitable polymers include 88% to 99% hydrolyzed polyvinyl acetate. Other useful polymers include gelatin, gum arabic, methyl vinyl ether/maleic anhydride copolymers, polyvinyl pyrrolidones, and mixtures of these polymers.

The photopolymerizable element as described above is imagewise exposed, e.g., for about 5 seconds to about 5 minutes, through a suitable phototool, mask or transparency, e.g., a halftone dot image, to a source of actinic radiation which polymerizes the photopolymerizable layer in the areas beneath the clear image areas. The actinic radiation sources must transmit radiation in the actinic region that the free radical producing initiator is sensitive. Suitable sources include those rich in ultraviolet radiation, e.g., those disclosed in Plambeck, U.S. Pat. No. 2,760,863, Chu and Cohen, U.S. Pat. No. 3,649,268, Peiffer U.S. Pat. No. 4,157,407 and Haney and Lott, U.S. Pat. No. 4,411,980, the disclosures of which are incorporated herein by reference.

The imagewise exposed photopolymerized elements (i) and (ii) are developed by treating the element (after removal of the overcoat layer, if present) with an acidic solution normally for about 0.125 to about 5 minutes to remove all the unexposed areas down the support. The element can be placed in the acid solution and agitation applied or the solution can be applied by spraying, brushing or rubbing onto the surface. Suitable acid solutions include: acetic, oxalic, hydrochloric, sulfuric acid, etc. The developer solution can be heated, e.g., to about 40° C., but this is not necessary.

Figure 4B:
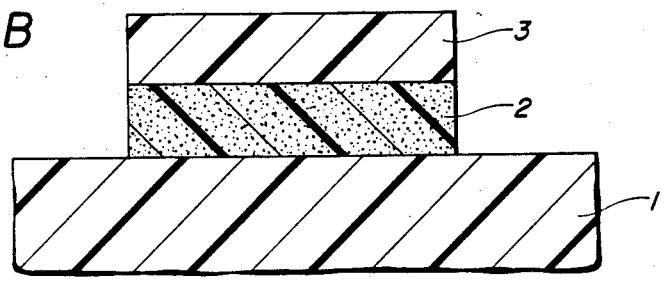
Figure 5A:
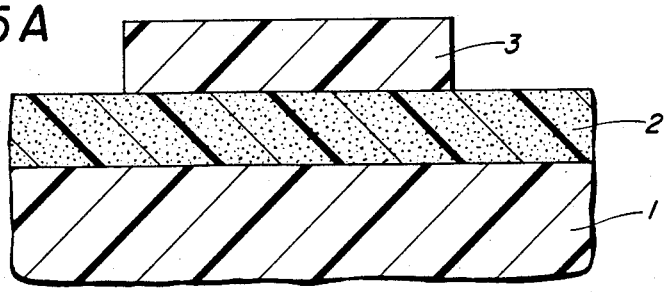

Development of element (iii) after exposure requires at least two development steps, three, if an initial water or aqueous alkaline wash is used to remove an optional but preferred clear, aqueous soluble overcoat layer which may be present as the outer layer of the element. The unexposed areas of photopolymerizable layer are removed by treatment with a relatively dilute acid solution which solubilizes the unexposed areas of the element followed by a treatment with hot water, e.g., about to 38° to 48° C., preferably about 42° C., which removes the solubilized unexposed areas and dissolves the binder in the lower nonphotosensitive layer thereby removing the colloidal silver containing layer from the support. This procedure is illustrated in FIG. 4B. If, however, the hot water treatment is replaced by a cold water treatment, e.g., below 25° C., the colloidal silver containing layer remains unaffected although the unexposed areas of the photopolymerizable layer are removed. This procedure is illustrated in FIG. 5A. The pigment in the nonphotosensitive layer beneath the areas of the removed upper layer are then bleached and fixed to produce a polymerized area or dot under the exposed photopolymer. In the case in which the pigment is colloidal silver it is possible to use techniques well known in the art of photography to remove silver from the lower layer. The silver metal is oxidized to silver ion and complexed so that it can be removed in solution. Potassium ferricyanide is the oxidizing or bleaching agent and sodium thiosulfate is the complexing or fixing agent. It is also possible that changes in solubility with change in oxidation state can similarly be employed with other pigments to remove them as required. Copper and nickel pigments can change oxidation state and solubility in a manner similar to silver via selection of the correct chemical environment, i.e., oxidant and chelating agent.

Figure 5B:
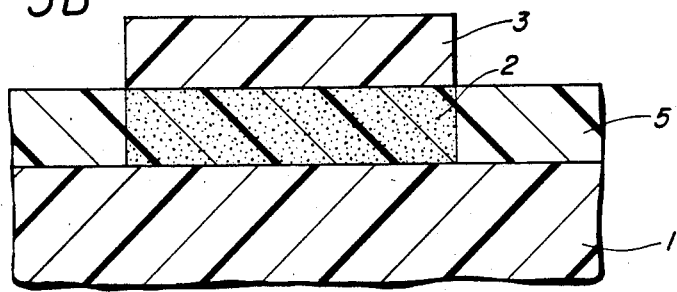

The developed element, including element (iii) illustrated in FIGS. 4B and 5B containing polymerized areas or dots, is then treated with a chemical solubilizing agent for the pigment which does not affect the photopolymerized layer but by diffusion into the layer etches away the pigment whereby the size and density of the pigmented image areas are reduced. The extent of the diffusion etching is easily controlled by treating the element with water. The particular pigment dispersed in the photopolymerizable layer determines the type of solubilizing agent that may be used. Suitable solubilizing agents for silver include dichromate salts, ferricyanide salts, ferric chloride, etc. A suitable basic solubilizing agent for aluminum is hydroxide, whereas copper containing pigments can be solubilized with ammonia. Zinc salts can be solubilized with thiosulfate or thiocyanide. Specific solubilizing agents are taken from the group consisting of $K_2Fe(CN)_6$, $FeCl_3$, $Na_2S_2O_3$, KCNS, KOH, HCl, $NH_3$, oxalic acid, and ethylenediaminetetraacetic acid. The pigment may be solubilized by the formation of a complex or chelate to perform the etching process. The developed element can be placed in the solubilizing agent or the solubilizing agent can be applied by brushing, spraying, etc. localized areas. The period of treatment with the solubilizing agent depends on various factors including the agent used, the dispersed pigment present and the desired amount of reduction of the image or dot. Longer diffusion etching treatment of element (ii) results in reduction of the optical density of the pigmented areas. A preferred embodiment is described in Example 1 below for element (i), Example 2 for element (ii) and Example 3 for element (iii).

INDUSTRIAL APPLICABILITY

The dot-etched photopolymer lithographic film prepared by the inventive process is useful in lithographic plate making, wherein a mask of the invention is one of a plurality of color separation masks. The size of the exposed areas (dots) is carried out to an extent whereby a composite color image produced with the masks (on a lithographic plate or on a proofing film) has the same tonal balance as the original color image. The elements prepared by the inventive process are capable of functioning in the aforementioned process, thereby providing a new and improved replacement for silver halide litho masks.

In use, a printer desiring to prepare full color prints of a process transparency would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which when processed and inked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded above described imaged photomasks have been assembled for proofing, it may be observed that the full color proof is, for example, too yellow, or too red, etc., either overall or in certain regions. In this instance, the imaged photomask corresponding to the excess color would be corrected by dot-etching, either overall or locally. After dot-etching, the imaged photomasks would be reassembled and inspected again. Further corrections may be necessary, and they would be made until the assembled masks gave the full-color reproduction desired. When satisfactory, each mask would then be used to expose a photosensitive printing plate.

EXAMPLES

The following examples illustrate the invention wherein the percentages are by weight. The molecular weights of polymeric compounds are weight average molecular weights ($\overline{M}_w$). The $\overline{M}_w$ of the polymers can be determined by using a light scattering technique using known standard samples, e.g., polystyrene, polymethacrylic acid, polymethylmethacrylate, etc., as known to those skilled in the art.

Example 1

A pigmented photopolymerizable composition was prepared as follows:

| Ingredient | Amount (g) |
| --- | --- |
| Methylene chloride | 130.0 |
| Methanol | 12.0 |
| Terpolymer of methylmethacrylate(37%)/ dimethylaminoethylmethacrylate(35%)/ hydroxyethylmethacrylate(28%)[(1)] | 10.0 |
| Benzophenone | 2.1 |
| Michler's ketone | 0.3 |
| 2,2'-bis(o-chlorophenyl)-4,4',5,5'-tetraphenyl biimidazole | 2.0 |
| 2-mercaptobenoxazole | 0.5 |
| Triethylene glycol dimethacrylate | 3.0 |
| Copper powder, U.S. Bronze C112, ave. particle size 5 μm | 35.0 |
| Polystabil V6596 (VZ) from Stockhausen, anionic polyelectrolyte dispersant distributed by Mobay Chemicals, Pittsburgh, PA | 0.5 |

[(1)]Terpolymer prepared as a solution polymer in toluene/ethyl acetate using azobis-dimethyl valeronitrile (VAZO ® 67, E. I. du Pont de Nemours and Company) initiator in a glass reactor with a head.

The ingredients were ball milled overnight and the composition was coated on a polyethylene terephthalate film support (1 in FIG. 1A) to a dry thickness of ~0.0002 inch (0.005 mm). Over the dry pigmented photopolymer layer (2 in FIG. 1A) was coated a polyvinyl alcohol oxygen barrier layer, 0.0008 inch (~0.002 mm) thick (3 in FIG. 1A).

Figure 1B:
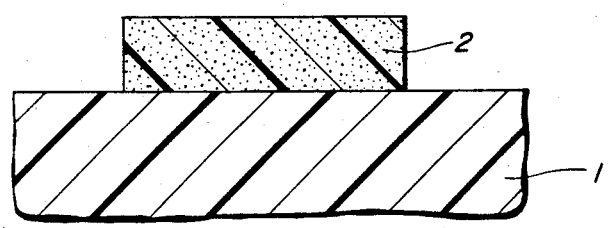
FIGS. 1B, 2B, 4B, and 5A are cross-sections of the photopolymerizable elements of FIGS. 1A, 2A, 4A and 4A, respectively, after imagewise exposure and liquid development.

The photopolymer element was imagewise exposed through a target with a pulsed Xenon Arc at 4 kw for 30 seconds at a distance of 46 cm. The exposed element was processed first in water to remove the polyvinyl alcohol layer, next in a sodium thiosulfate (10%)/acetic acid(17%) fixer at pH 5 to solubilize the unexposed areas, and finally in water to remove the solubilized polymers. The processed element is illustrated in FIG. 1B.

Figure 1C:
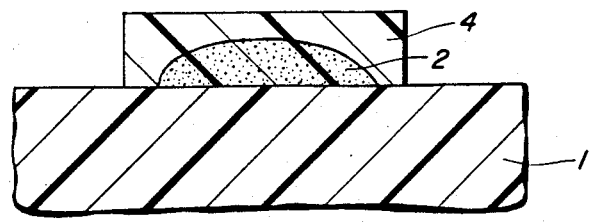
FIGS. 1C, 2C, 4C, and 5C are cross-sections of the elements of FIGS. 1B, 2B, 4B, and 5B, respectively, after being dot-etched according to the invention.

The element was dot-etched with 5% ammonia FIG. 1C illustrates the dot-etched element where 4 represents the clear photopolymer areas where pigment has been dissolved.

Example 2

The pigmented photopolymer layer described in Example 1 (layer 2 in FIG. 2A) was prepared and coated on a polyethylene terephthalate film (layer 1 in FIG. 2A) as described in that example. A clear photopolymer composition was prepared by mixing the following ingredients:

| Ingredient | Amount (g) |
| --- | --- |
| Methylene chloride | 92.0 |
| Methanol | 8.0 |
| Terpolymer of methylmethacrylate(37%)/ dimethylaminoethylmethacrylate(35%)/ hydroxyethylmethacrylate(28%) (see Example 1) | 10.0 |
| Benzophenone | 2.1 |
| Michler's ketone | 0.3 |
| 2,2'-bis(o-chlorophenyl)-4,4',5,5'-tetraphenyl biimidazole | 1.0 |
| 2-mercaptobenoxazole | 0.5 |
| Trimethylol propane triacrylate | 5.0 |
| Triethylene glycol dimethacrylate | 5.0 |

Figure 2A:
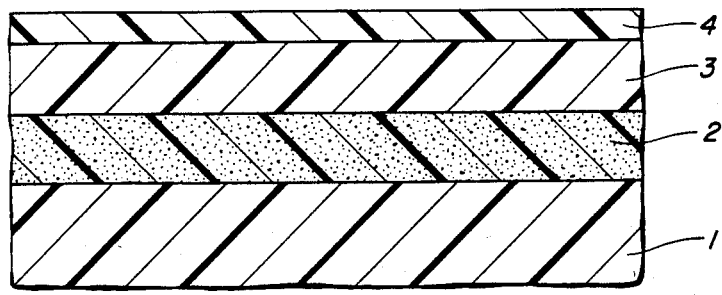
Figure 2B:
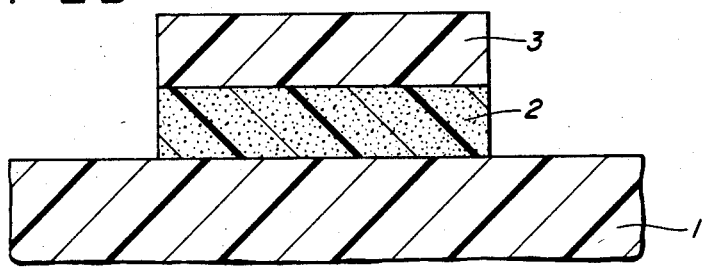
Figure 2C:
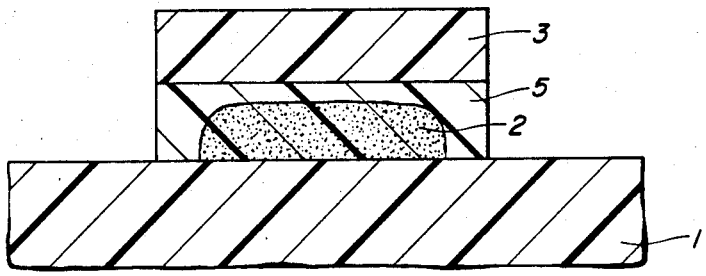
Figure 3:
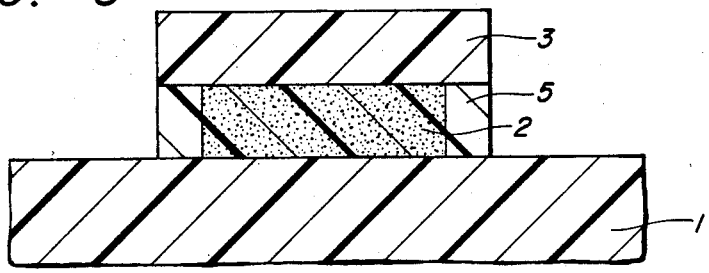
FIG. 3 is a cross-section of a photopolymerizable element of structure similar to that of FIG. 2A after imagewise exposure, liquid development and dot-etching without loss of dot density.

The clear photopolymer composition was coated over the dry pigmented photopolymer layer as described in Example 1 and allowed to dry (layer 3 in FIG. 2A). A polyvinyl alcohol (layer 4 in FIG. 2A) as described in Example 1 was coated over the clear photopolymer layer as described in Example 1. Element (ii) is illustrated in FIG. 2A. The element was exposed and developed with acid solution as described in Example 1. The developed element is illustrated in FIG. 2B. The element was dot-etched as described in Example 1. FIG. 2C illustrates the dot-etched element where 5 represents the clear photopolymer areas where pigment has been dissolved.

Example 3

A colloidal silver in gelatin composition was prepared as follows:

Solution I

| Solution I | |
| --- | --- |
| Limed bone gelatin | 96 g |
| Water (cold) | 1680 g |

The gelatin was slowly added to the cold water and stirred for 15 minutes to allow the gelatin to swell. The gelatin was then dissolved by raising the temperature to 40° C. and holding for 15 minutes.

| | |
| --- | --- |
| NaOH 3N solution | 7 ml |
| The caustic was added to obtain a pH of 9.0. | |

Solution II

A 14.5 g portion of strontium nitrate was dissolved in 132 ml water. Then 150 ml of 3N silver nitrate solution was added at 40° C.

Solution II was added to Solution I with stirring at 40° C. After holding for 15 minutes at 40° C. Solution III below was added in 60 seconds.

Solution III

| | | |
| --- | --- | --- |
| Water | 330.0 | ml |
| Sodium Sulfite (anhydrous) | 62.5 | g |
| Hydroquinone | 12.75 | g |

The combination of the three solutions was heated to 40° C. and stirred until dissolved.

After the addition of Solution III to the combination of I and II the colloidal silver was digested at 40° C. for 30 minutes. A blue-black colloidal silver suspension was produced which was 11.2% solids and had a pH of 5.2.

A layer of the gelatin/colloidal silver was coated on a polyethylene terephthalate support (layer 1 of FIG. 4A) to give a coating weight of about 0.7 g/m² of silver. The dried layer (layer 2 of FIG. 4A) was then overcoated with a clear photopolymer composition prepared from the following ingredients:

| Ingredient | Amount (g) |
| --- | --- |
| Methylene chloride | 92.0 |
| Methanol | 8.0 |
| Terpolymer of methylmethacrylate(37%)/ dimethylaminoethylmethacrylate(35%)/ hydroxyethylmethacrylate(28%) (see Example 1) | 10.0 |

-continued

| Ingredient | Amount (g) |
|---|---|
| Triethylene glycol dimethacrylate | 5.0 |
| Trimethylol propane triacrylate | 5.0 |
| Benzophenone | 2.1 |
| Michler's ketone | 0.3 |
| 2,2'-bis(o-chlorophenyl)-4,4',5,5'-tetraphenyl biimidazole | 1.0 |
| 2-mercaptobenoxazole | 0.5 |

Figure 4A:
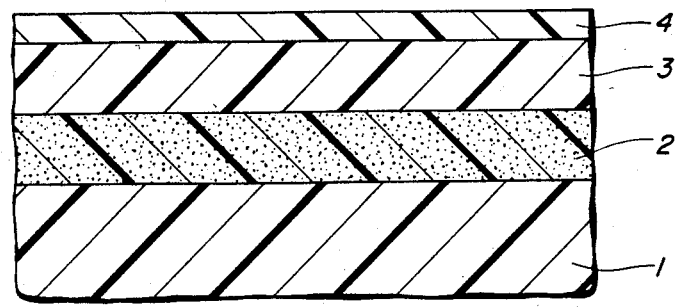

The photopolymer composition was coated over the gelatin-colloidal silver layer with a 0.004 inch (0.10 mm) doctor knife and allowed to dry (layer 3 in FIG. 4A). A polyvinyl alcohol layer (layer 4 in FIG. 4A) was applied to the dry photopolymer surface by lamination of a polyvinyl alcohol coating on polyethylene terephthalate film, 0.001 inch (0.025 mm) in thickness and peeling off the polyethylene terephthalate film prior to exposure. Element (iii) is illustrated in FIG. 4A.

The photopolymer element was imagewise exposed through a target with a Pulsed Xenon Arc at 4 kw for 20 seconds at a distance of 46 cm. The exposed element was processed through a Crona-Lite ® Model II Processor, manufactured by E. I. du Pont de Nemours and Company, Wilmington, DE at 160 inches/minute (406.4 cm/minute) in which the surface was sprayed in three steps: (1) cold water removed the water soluble polyvinyl alcohol (layer 4 of FIG. 4A); (2) sodium thiosulfate and acetic acid fixer pH 5 solution solubilized the unexposed areas, (3) hot water (38° C.) removed the solubilized polymer and dissolved the gelatin to remove the underlaying colloidal silver layer (See FIG. 4B).

Figure 4C:
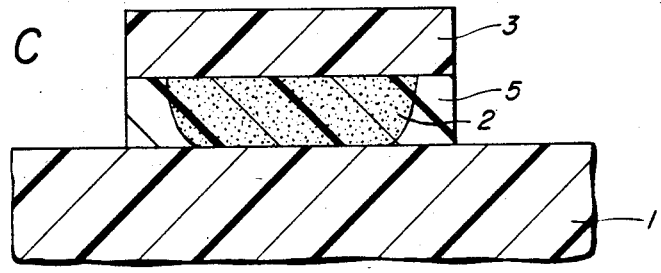

The colloidal silver was then dot-etched with a 15% $K_2Fe(CN)_6$ solution or alternatively with a 42 Baumé ferric chloride etchant solution. The silver was observed to dissolve from the edges without decrease in dot density leaving the gelatin in the layer unchanged (5 of FIG. 4C). The dot-etched element is illustrated in FIG. 4C.

Figure 5C:
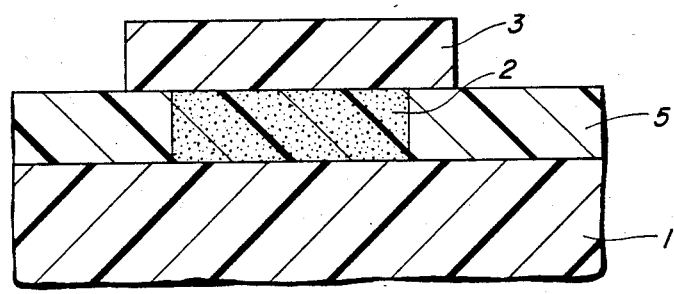

A second element prepared as described above was exposed and processed except that the final spray (3) in the processor was cold water (20° C.) (See FIG. 5A). As a result the colloidal silver was not removed beneath unexposed areas where the solubilized polymer was washed away (2 of FIG. 5A). With the hardened photopolymer acting as a relief mask the exposed silver was bleached with a water solution of potassium ferricyanide and then fixed with an acidic solution of sodium thiosulfate to produce clear areas and produce a dot pattern (5 of FIG. 5B) under the exposed photopolymer (See FIG. 5B). The dots were then dot-etched as described in Example 1 to provide a sharper dot image than by the hot water process (See FIG. 5C).

Example 4

Two photopolymer compositions were prepared by mixing the following ingredients:

| | A | B |
|---|---|---|
| Methylene chloride | 138.0 | 138.0 |
| Methanol | 12.0 | 12.0 |
| Terpolymer of laurylmethacrylate(25%)/methylmethacrylate(12)/dimethylamino ethylmethacrylate(35)/hydroxyethylmethacrylate(28) prepared by solution polymerization | 10.0 | 10.0 |
| Benzophenone | 2.1 | 2.1 |
| Michler's ketone | 0.3 | 0.3 |
| 2,2'-bis(o-chlorophenyl)-4,4';5,5'-tetraphenyl biimidazole | 1.0 | 1.0 |
| 2-mercaptobenoxazole | 0.5 | 0.5 |
| Trimethylol propane triacrylate | 7.5 | 7.5 |
| Aluminum toner, Cromalin ® MS-1 toner, E. I. du Pont de Nemours and Company, Wilmington, DE | 15 | — |
| Anionic surfactant of the formula: | 1.0 | — |

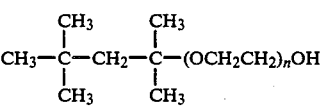

n is 9 or 10; Triton ® X-100
Rohm and Haas, Philadelphia, PA

The pigmented photopolymer, composition A, was coated on a polyethylene terephthalate support with a 0.002 inch (0.051 mm) doctor knife and was dried. The dry pigmented photopolymer layer was coated with clear photopolymer layer B. A polyvinyl overcoat layer was laminated on the surface of layer B as described in Example 3. Element (ii) is illustrated in FIG. 2A. The element was imagewise exposed and developed as described in Example 1. The developed element is illustrated in FIG. 2B. The aluminum was dot-etched in 15% $K_2CO_3$ solution containing 1% of the anionic surfactant present in the photopolymerizable composition. The aluminum was observed to slowly dissolve at the high pH to produce the dot-etched film shown in FIG. 2C.

Example 5

Pigmented photopolymer, composition A, of Example 4 was prepared and coated on a polyethylene terephthalate support and overcoated with a polyvinyl alcohol coating as described in Example 1. The element was imagewise exposed, developed and dot-etched as described in Example 4. The process is illustrated in FIGS. 1A, 1B and 1C.

I claim:
1. A process for the preparation of a dot-etched photopolymerizable lithographic film which comprises
   (A) exposing imagewise to actinic radiation a photpolymerizable element taken from the group consisting of
      (i) a support bearing a layer of an acid soluble photopolymerizable composition having dispersed therein a chemically soluble pigment;
      (ii) a support bearing, in order
         (a) a layer of acid soluble photopolymerizable composition having dispersed therein a chemically soluble pigment,
         (b) a layer of clear, unpigmented acid soluble photopolymerizable composition which is the same or different from the composition of layer (a); and
      (iii) a support bearing, in order
         (a) a nonphotosensitive layer of an aqueous soluble polymeric binder having dispersed therein a chemically soluble pigment,
         (b) a layer of a clear, unpigmented acid soluble photopolymerizable composition comprising an acid soluble binder;
   (B) developing the exposed element with an acid solution with the proviso that when the photopo- lymerizable element is type (iii) the acid development solution is followed by treatment with water; and (C) treating the developed element with chemical solubilizing agent for the pigment whereby there occurs diffusion etching of the image.

2. A process according to claim 1 wherein the photopolymerizable element consists essentially of (i) a support bearing, in order, a layer of an acid soluble photopolymerizable composition, and, an aqueous soluble overcoat layer, the photopolymerizable layer having dispersed therein a chemically soluble pigment.

3. A process according to claim 1 wherein the photopolymerizable element consists essentially of (ii) a support bearing, in order (a) a layer of acid soluble photopolymerizable composition having dispersed therein a chemically soluble pigment, (b) a layer of clear, unpigmented acid soluble photopolymerizable composition which is the same or different from the composition of layer (a), and, (c) a clear aqueous soluble overcoat layer.

4. A process according to claim 1 wherein the photopolymerizable element consists essentially of (iii) a support bearing, in order (a) a nonphotosensitive layer of an aqueous soluble polymeric binder having dispersed therein a chemically soluble pigment, (b) a layer of a clear, unpigmented acid soluble photopolymerizable composition comprising an acid soluble binder, and, (c) a clear aqueous soluble overcoat layer.

5. A process according to claim 1 wherein one or more acid soluble photopolymerizable layers contain a polymeric binder of dimethylaminoethylmethacrylate/hydroxyethylmethacrylate/methylmethacrylate terpolymer.

6. A process according to claim 1 wherein one or more acid soluble photopolymerizable layers contain a polymeric binder of laurylmethacrylate/methylmethacrylate/dimethylaminoethyl methacrylate/hydroxyethylmethacrylate tetrapolymer.

7. A process according to claim 1 wherein the chemically soluble pigment is copper.

8. A process according to claim 1 wherein the chemically soluble pigment is aluminum.

9. A process according to claim 1 wherein the photopolymerizable composition for layers (a) and (b) of element (ii) are different.

10. A process according to claim 1 wherein the imagewise exposed element is developed in step (B) with acetic acid.

11. A process according to claim 1 wherein the imagewise exposed element is developed in step (B) with hydrochloric acid.

12. A process according to claim 1 wherein the developed element is treated in step (C) with a chemical solubilizing agent which is neutral or has basic pH.

13. A process according to claim 12 wherein the chemical solubilizing agent has a basic pH.

14. A process according to claim 13 wherein the chemical solubilizing agent is an alkali hydroxide or ammonia.

15. A process according to claim 2 wherein the aqueous soluble layer is polyvinyl alcohol.

16. A process according to claim 2 wherein prior to developing the exposed element with acid solution the element is developed with water to remove the aqueous soluble layer.

17. A process according to claim 1 wherein in step (B) the water is below 25° C.

18. A process according to claim 17 wherein the chemically soluble pigment is colloidal silver which after said acid development and water treatment is bleached with ferricyanide solution and fixed with thiosulfate solution.

19. A process according to claim 3 wherein the aqueous soluble layer is polyvinyl alcohol.

20. A process according to claim 4 wherein the aqueous soluble layer is polyvinyl alcohol.

21. A process according to claim 3 wherein prior to developing the exposed element with acid solution the element is developed with water to remove the aqueous soluble layer.

22. A process according to claim 4 wherein prior to development the exposed element with acid solution the element is developed with water to remove the aqueous soluble layer.

* * * * *